(12) United States Patent
Hwang et al.

(10) Patent No.: US 9,984,960 B2
(45) Date of Patent: May 29, 2018

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Chien-Ling Hwang, Hsinchu (TW); Ching-Hua Hsieh, Hsinchu (TW); Hsin-Hung Liao, Taipei (TW); Ying-Jui Huang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days. days.

(21) Appl. No.: 15/215,598

(22) Filed: Jul. 21, 2016

(65) Prior Publication Data
US 2018/0025966 A1   Jan. 25, 2018

(51) Int. Cl.
*H01L 23/52* (2006.01)
*H01L 23/498* (2006.01)
*H01L 21/683* (2006.01)
*H01L 21/48* (2006.01)
(Continued)

(52) U.S. Cl.
CPC ...... *H01L 23/49805* (2013.01); *H01L 21/486* (2013.01); *H01L 21/4846* (2013.01); *H01L 21/6835* (2013.01); *H01L 23/49827* (2013.01); *H01L 24/02* (2013.01); *H01L 24/13* (2013.01); *H01L 24/16* (2013.01); *H01L 24/73* (2013.01); *H01L 2021/60022* (2013.01); *H01L 2221/68359* (2013.01); *H01L 2224/024* (2013.01); *H01L 2224/02379* (2013.01);
(Continued)

(58) Field of Classification Search
CPC ......... H01L 23/49827; H01L 23/49805; H01L 21/486; H01L 21/6835; H01L 24/73; H01L 24/16; H01L 24/13; H01L 24/05; H01L 21/4846
USPC ....................................................... 257/737
See application file for complete search history.

(56) References Cited

U.S. PATENT DOCUMENTS 4,418,857 A * 12/1983 Ainslie ................ B23K 35/001
228/124.1
4,672,739 A *  6/1987 Churchwell ........ H01L 21/4853
257/784
(Continued)

*Primary Examiner* — Luan C Thai
(74) *Attorney, Agent, or Firm* — JCIPRNET

(57) ABSTRACT

Provided is an integrated fan-out package including a die, a first redistribution circuit structure, a second redistribution circuit structure, a plurality of solder joints, a plurality of conductive posts, and an insulating encapsulation. The first redistribution circuit structure and the second redistribution circuit structure are formed respectively over a back surface and an active surface of the die to sandwich the die. The solder joints are formed aside the die and connected to the first redistribution circuit structure. The conductive posts are formed on the solder joints and connected to the second redistribution circuit structure, and connected to the first redistribution circuit structure through the solder joints. A plurality of sidewalls of the die, a plurality of sidewalls of the conductive posts, and a plurality of sidewalls of the solder joints are encapsulated by the insulating encapsulation. A fabricating process of the integrated fan-out package is also provided.

20 Claims, 13 Drawing Sheets

(51) Int. Cl.
*H01L 23/00* (2006.01)
*H01L 21/60* (2006.01)

(52) U.S. Cl.
CPC ............... *H01L 2224/1301* (2013.01); *H01L 2224/16235* (2013.01); *H01L 2224/73253* (2013.01)

(56) References Cited

U.S. PATENT DOCUMENTS

| | | | |
|---|---|---|---|
| 5,640,052 A * | 6/1997 | Tsukamoto | H01L 24/81 257/738 |
| 6,555,757 B2 * | 4/2003 | Saiki | H01L 23/49811 174/255 |
| 8,193,034 B2 * | 6/2012 | Pagaila | H01L 21/6835 257/686 |
| 8,361,842 B2 | 1/2013 | Yu et al. | |
| 8,669,651 B2 * | 3/2014 | Yang | H01L 23/5385 257/686 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,975,741 B2 * | 3/2015 | Lin | H01L 21/568 257/700 |
| 9,252,065 B2 * | 2/2016 | Lin | H01L 25/50 |
| 9,443,797 B2 * | 9/2016 | Marimuthu | H01L 23/5389 |
| 9,461,018 B1 * | 10/2016 | Tsai | H01L 21/6836 |
| 9,520,385 B1 * | 12/2016 | Chen | H01L 25/105 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0221601 A1 * | 8/2015 | Kim | H01L 24/02 257/782 |
| 2016/0071820 A1 * | 3/2016 | Yu | H01L 21/6835 257/737 |
| 2016/0099210 A1 * | 4/2016 | Kwon | H01L 21/76829 257/774 |

* cited by examiner

INTEGRATED FAN-OUT PACKAGE AND METHOD OF FABRICATING THE SAME

BACKGROUND

The semiconductor industry has experienced rapid growth due to continuous improvement in the integration density of various electronic components (i.e., transistors, diodes, resistors, capacitors, etc.). For the most part, the improvement in integration density has come from gradual reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. How to reduce fabrication costs of the integrated fan-out packages are important issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
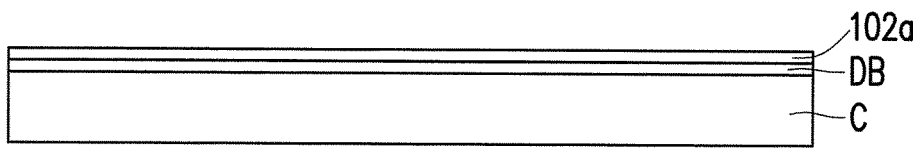
FIG. 1 to FIG. 15 are schematic cross sectional views of various stages in a fabricating process of an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 15 are schematic cross sectional views of various stages in a fabricating process of an integrated fan-out package in accordance with some embodiments.

Referring to FIG. 1, a carrier C having a de-bonding layer DB and a first dielectric layer 102a formed thereon is provided, wherein the de-bonding layer DB is formed between the carrier C and the first dielectric layer 102a. In some embodiments, the carrier C is a glass substrate, the de-bonding layer DB is a light-to-heat conversion (LTHC) release layer formed on the glass substrate, and the first dielectric layer 102a is a photosensitive polybenzoxazole (PBO) layer formed on the de-bonding layer DB. In alternative embodiments, the de-bonding layer DB may be a photo-curable release film whose stickiness is decreased by a photo-curing process or a thermal curable release film whose stickiness is decreased by a thermal-curing process, and the first dielectric layer 102a may be made of other photosensitive or non-photosensitive dielectric materials. In some embodiments, the first dielectric layer 102a may be a polybenzoxazole (PBO) layer, a polyimide (PI) layer or other suitable dielectric layers.

Figure 2:
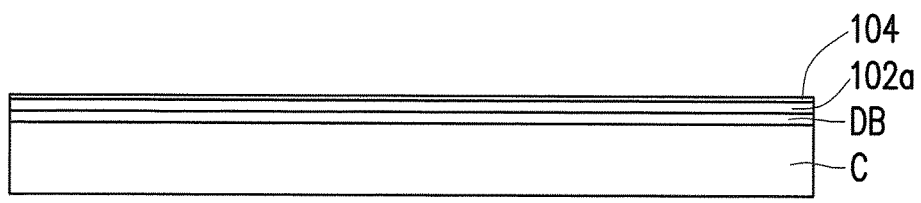

Referring to FIG. 2, a seed layer 104 is formed over the first dielectric layer 102a, for example, through physical vapor deposition (PVD). In some embodiments, physical vapor deposition includes sputtering deposition, vapor deposition, or any other suitable method. The seed layer 104 may be a metal seed layer including copper, aluminum, titanium, alloys thereof, or multi-layers thereof. In some embodiments, the seed layer 104 includes a first metal layer such as a titanium layer (not shown) and a second metal layer such as a copper layer (not shown) over the first metal layer.

Figure 3:
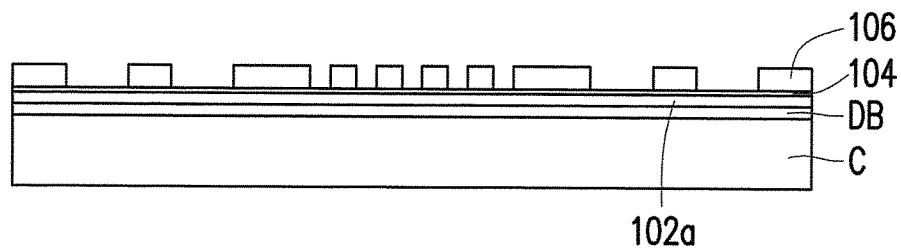

Referring to FIG. 3, after the seed layer 104 is formed, a patterned photoresist layer 106 is formed on the seed layer 104. The patterned photoresist layer 106 has a plurality of openings, such that portions of the seed layer 104 are exposed by the openings of the patterned photoresist layer 106.

Figure 4:
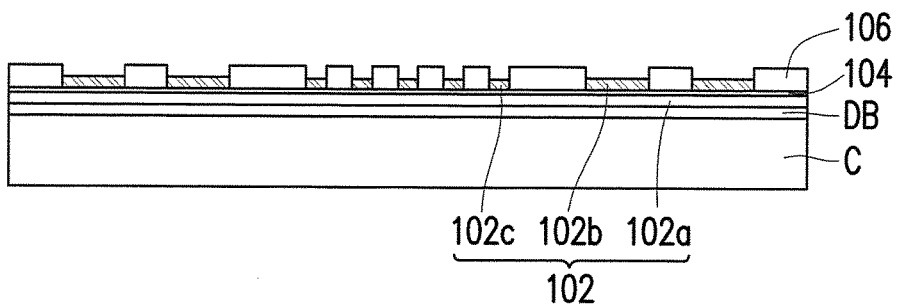

Referring to FIG. 4, first redistribution conductive layers 102b and 102c are formed on the portions of the seed layer 104 through, for example, a plating process. Specifically, the first redistribution conductive layers 102b are formed aside the first redistribution conductive layers 102c. The first redistribution conductive layers 102b and 102c are plated on the portions of the seed layer 104 exposed by the openings of the patterned photoresist layer 106. In some embodiments, the first redistribution conductive layers 102b and 102c may be metal layers including copper, aluminum, titanium, or alloys thereof.

Figure 5:
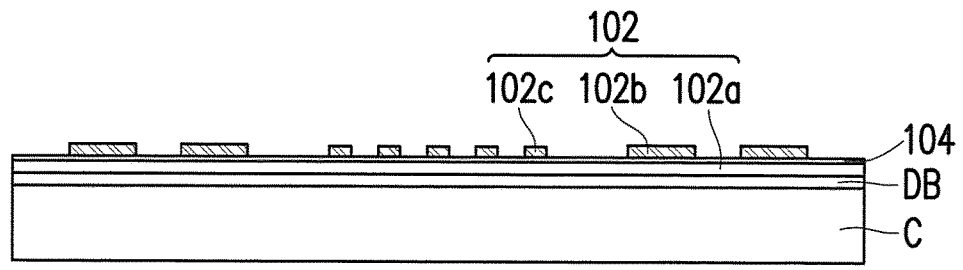

Referring to FIG. 4 and FIG. 5, after the first redistribution conductive layers 102b and 102c are formed, the patterned photoresist layer 106 is stripped such that the portions of the seed layer 104 that are not covered by the first redistribution conductive layers 102b and 102c are exposed.

Figure 6:
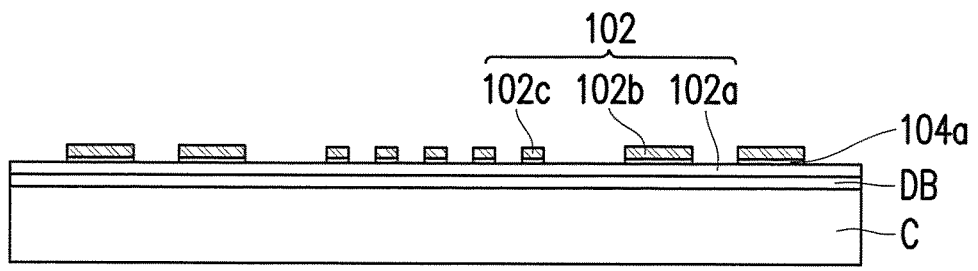

As shown in FIG. 6, by using the first redistribution conductive layers 102b and 102c as a mask, the portions of the seed layer 104, which are not covered by the first redistribution conductive layers 102b and 102c, are removed so as to form seed layers 104a and expose surfaces of the first dielectric layer 102a. That is, the portions of the seed layer 104 overlapped by the first redistribution conductive layers 102b and 102c are not etched and remain to form the seed layers 104a. Therefore, a first redistribution circuit structure 102 is formed. The first redistribution circuit structure 102 includes the first dielectric layer 102a and the first redistribution conductive layers 102b and 102c thereon. Throughout the description, the remaining portions of the seed layer 104a are referred to as bottom portions of the first redistribution conductive layers 102b and 102c. In subsequent drawings, the remaining portions of the seed layer 104a are considered as portions of the first redistribution conductive layers 102b and 102c, and are not shown separately.

On the other hand, as shown in FIG. 6, only one layer of the first dielectric layer 102a, one layer of the first redistribution conductive layers 102b, and one layer of the first redistribution conductive layers 102c are shown in FIG. 6; however, the disclosure is not limited thereto. In alternative embodiments, the number of the layers and arrangement of the first dielectric layer 102a and the first redistribution conductive layers 102b and 102c may be adjusted based on the design and the requirements of the products. After the first redistribution circuit structure 102 is formed, the formation of another dielectric layer directly on the first redistribution circuit structure 102 and the first dielectric layer 102a and the process of patterning another dielectric layer are omitted.

Figure 7:
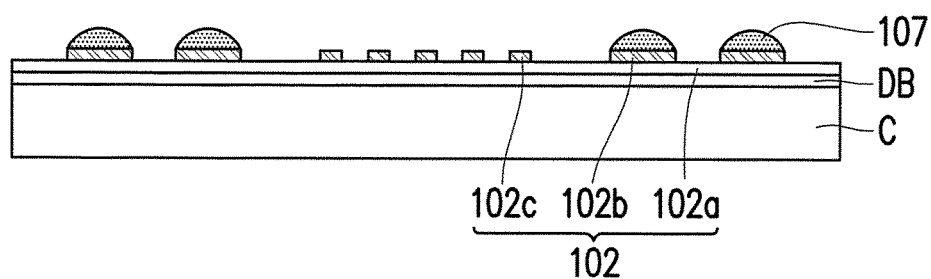
Figure 8:
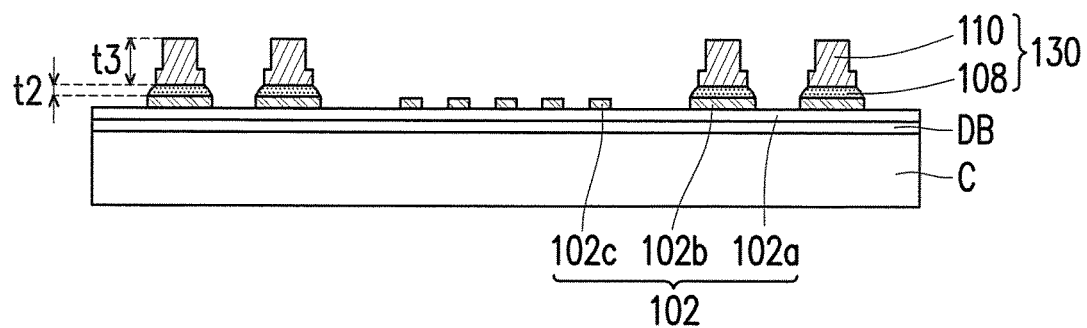

Referring to FIG. 7 and FIG. 8, a plurality of solder pastes 107 are formed on the first redistribution conductive layers 102b. A plurality of conductive posts 110 are mounted on the solder pastes 107. Then, a reflowing process is performed, so that the solder pastes 107 are reflowed to form solder joints 108, and the conductive posts 110 are bonded onto the first redistribution conductive layers 102b through the solder joints 108. Referring to FIG. 7 and FIG. 8, the material of the solder paste 107 and the material of the conductive posts 110 are different. In some embodiments, a melting point of the solder pastes 107 is lower than a melting point of the conductive posts 110. In some embodiments, the solder pastes 107 may include metal layers including tin, silver, copper, or alloys thereof. The solder pastes 107 may be formed by printing, jetting, or other suitable methods, for example. The conductive posts 110 include metal including copper or other suitable metals. In some embodiments, the conductive posts 110 are pre-fabricated and available from material suppliers.

Figure 19:
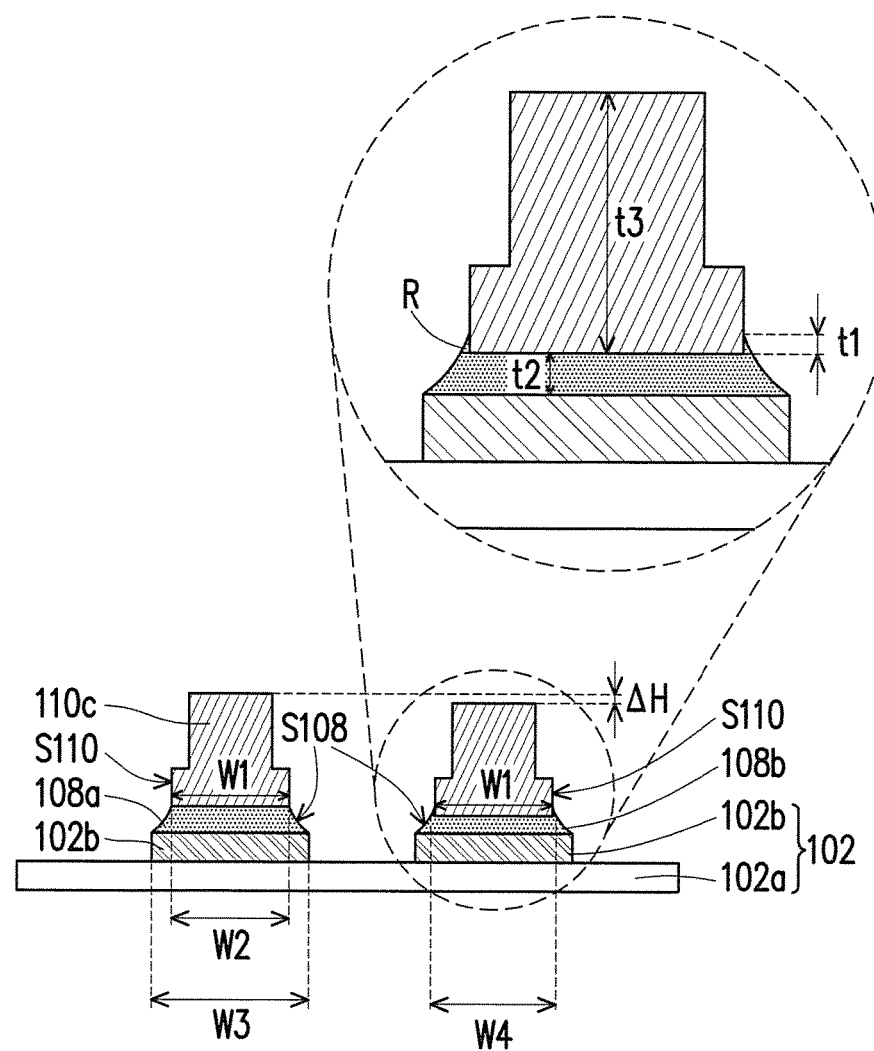
FIG. 19 is an enlarged schematic partial cross sectional view of the conductive posts of FIG. 8.

Referring to FIG. 8, conductive structures 130 include first portions and second portions. The first portions are the solder joints 108 and the second portions are the conductive posts 110, for example. Sidewalls of the solder joints 108 and sidewalls of the conductive posts 110 have different profiles. In some embodiments, the conductive posts 110 have straight sidewalls and the solder joints 108 have tapered sidewalls (as shown in FIG. 8) or the conductive posts 110c have stepped sidewalls and the solder joints 108b have arc-sidewalls (as shown in FIG. 19).

Figure 16A:
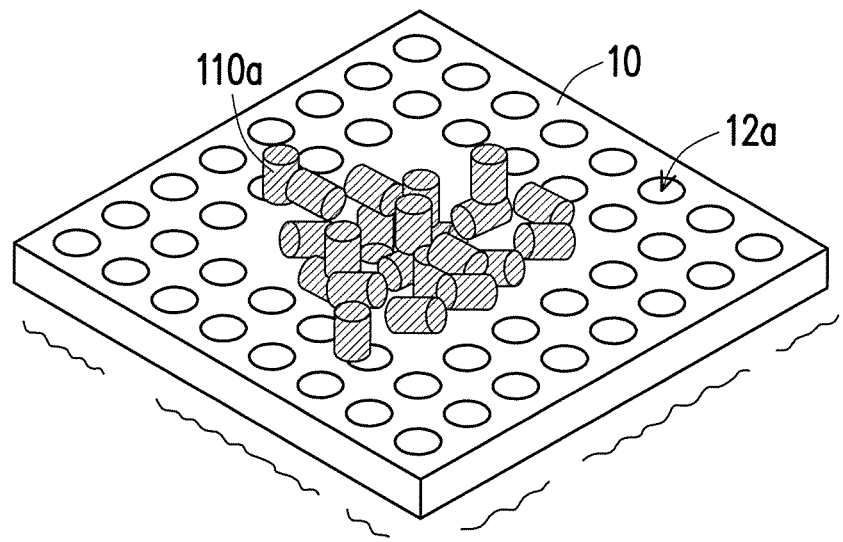
FIG. 16A to FIG. 16C are schematic perspective views of various stages in the fabricating process of the integrated fan-out package of FIG. 8.
Figure 16B:
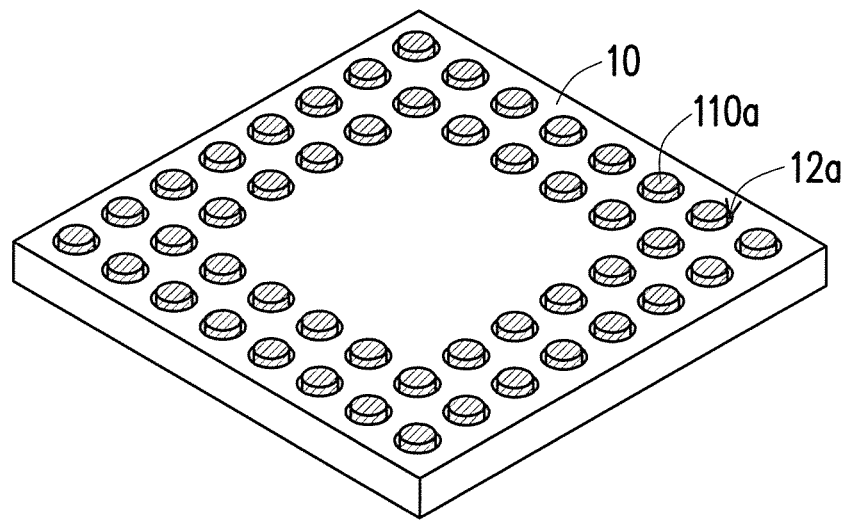
Figure 16C:
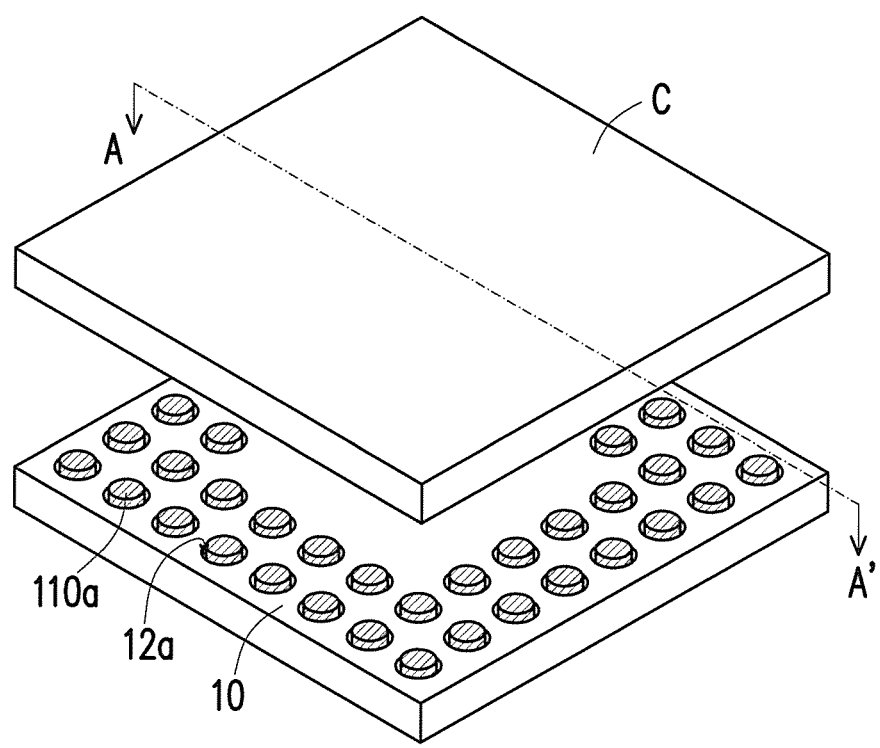

FIG. 16A to FIG. 16C are schematic perspective views of various stages in the fabricating process of the integrated fan-out package of FIG. 8. Specifically, as shown in FIG. 16A and FIG. 16B, a plurality of the pre-fabricated conductive posts 110a are provided on a pallet 10 and placed in holes 12a of the pallet 10. In some embodiments, the pre-fabricated conductive posts 110a include copper posts or other suitable metal posts. The pallet 10 is, for example, vibrated by a vibration machine such that the conductive posts 110a are partially inserted into the holes 12a of the pallet 10. Since the conductive posts 110a are pre-fabricated, the conductive posts 110a with a predetermined aspect ratio can be easily fabricated. Furthermore, the fabrication costs and the fabrication cycle time of the conductive posts 110a are reduced because the conductive posts 110a are not fabricated by sputtering, photolithography, plating, and photoresist stripping processes.

In some embodiments, the conductive posts 110a are pre-fabricated. The characteristics (e.g. width, height, shape, electrical conductivity, and so on) of the pre-fabricated conductive posts 110a may be inspected in advance. Accordingly, the yield rate of production of the conductive posts 110a can be increased.

Referring to FIG. 16B and FIG. 16C, the carrier C is flipped onto the pallet 10 (i.e. the carrier C is turned upside down). The following process refers to FIG. 17A to FIG. 17C.

Figure 17A:
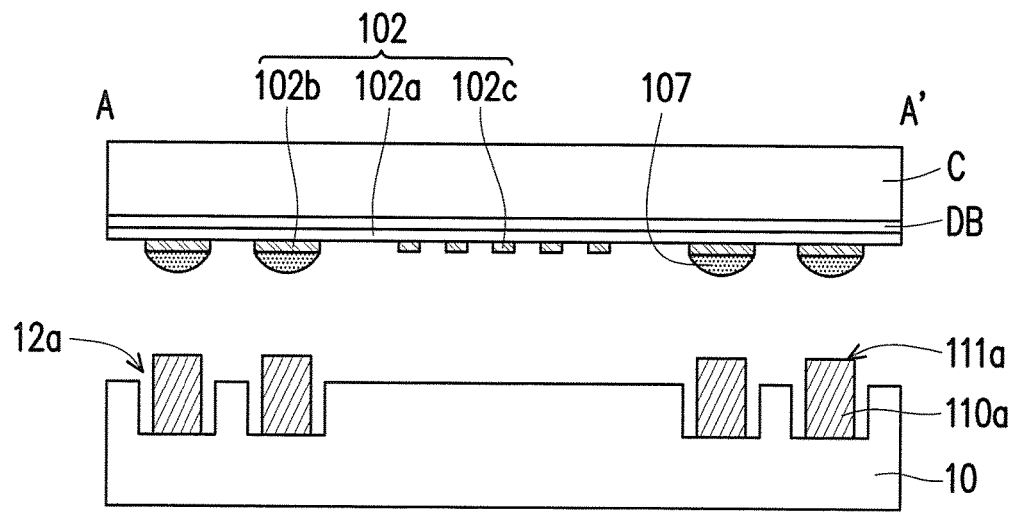
FIG. 17A to FIG. 17C are schematic cross sectional views of various stages in the fabricating process of the integrated fan-out package along cut line A-A' of FIG. 16C.
Figure 17B:
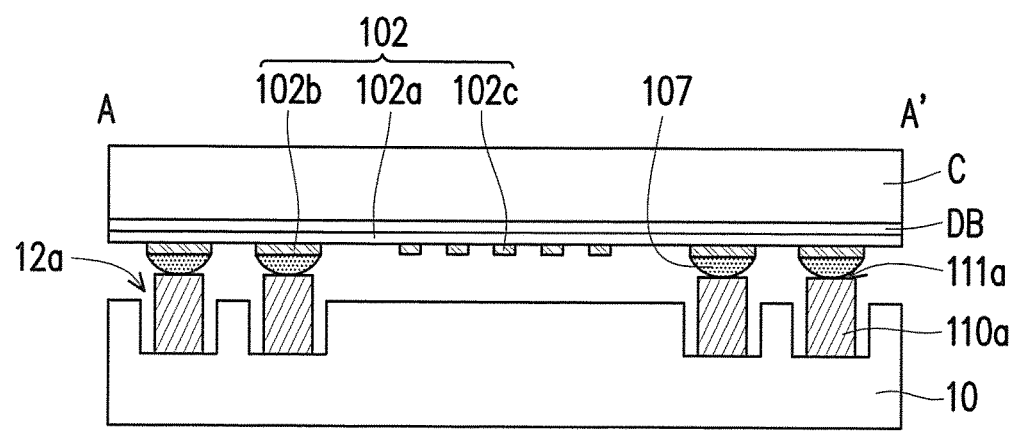
Figure 17C:
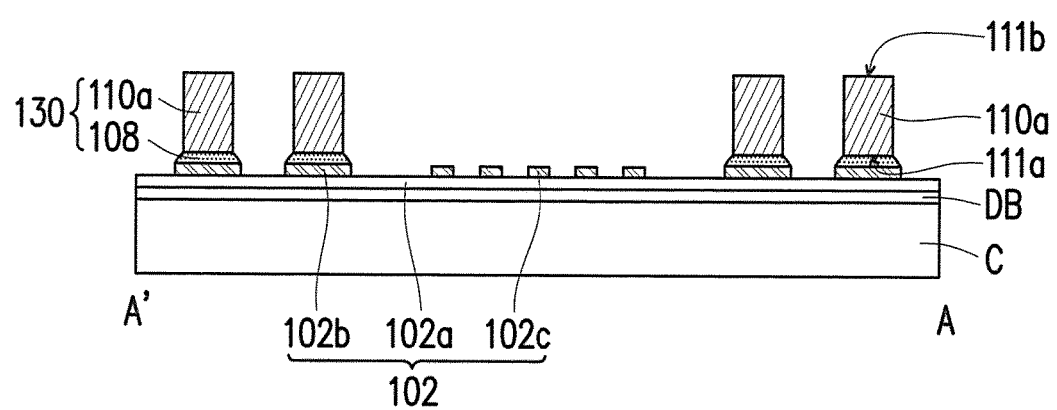
Figure 18:
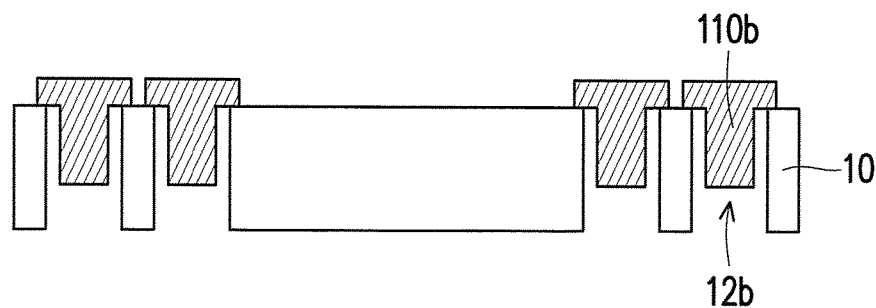
FIG. 18 is a schematic cross sectional view of a pallet in accordance with alternative embodiments.

FIG. 17A to FIG. 17C are schematic cross sectional views of various stages in the fabricating process of the integrated fan-out package along cut line A-A' of FIG. 16C. FIG. 18 is a schematic cross sectional view of a pallet in accordance with alternative embodiments. As shown in FIG. 17A and FIG. 17B, the solder pastes 107 on the flipped carrier C faces the conductive posts 110a in the holes 12a of the pallet 10, such that the solder pastes 107 are aligned with the conductive posts 110a in the holes 12a of the pallet 10. In some embodiments, the conductive posts 110a have an I-shape and are disposed in the holes 12a formed by blind holes in FIG. 17A. In alternative embodiments, as shown in FIG. 18, the conductive posts 110b have a T-shape or other suitable shapes that are easily fabricated and are disposed in holes 12b formed by through holes.

Then, as shown in FIG. 17B and FIG. 17C, the solder pastes 107 on the flipped carrier C contact with surfaces 111a of the conductive posts 110a. Next, the reflowing process is performed so that the solder pastes 107 are reflowed to form the solder joints 108, and the conductive posts 110a are fixed onto the first redistribution conductive layers 102b by the solder joints 108 (as shown in FIG. 17C). The melting point of the solder pastes 107 is lower than the melting point of the conductive posts 110a. Hence, when a reflow temperature reaches the melting point of the solder pastes 107, the solder pastes 107 are melted first, so as to achieve the bonding effects. At this time, the conductive posts 110a remain in the shape without being melted.

In alternative embodiments, when the carrier C is flipped onto and bonded with the pallet 10, the first redistribution conductive layers 102c are not in contact with the upper surface of the pallet 10. After the first redistribution conductive layers 102b are bonded to the surfaces 111a of the conductive posts 110a, the carrier C is driven to move upwardly to pull out the conductive posts 110a from the holes 12a of the pallet 10. The solder joints 108 provide sufficient adhesion to pull out the conductive posts 110a from the holes 12a of the pallet 10, such that the conductive posts 110a are transfer-bonded to the first redistribution conductive layers 102b. Afterwards, the carrier C is turned upside down again, as shown in FIG. 17C, so that the surfaces 111a of the conductive posts 110a fixed to the first redistribution conductive layers 102b face downward (i.e. the surfaces 111a face toward the carrier C) while surfaces 111b of the conductive posts 110a face upward and become the upper surfaces 111b.

As shown in FIG. 17B and FIG. 17C, since the holes 12a of the pallet 10 have flat lower surfaces and the pre-fabricated conductive posts 110a have similar or the same height, coplanarity between the upper surfaces 111b of the conductive posts 110a in FIG. 17C is better than the conventional plated conductive posts. After the conductive posts 110a are mounted, the upper surfaces 111b of the conductive posts 110a are substantially co-planar without performing the following grinding process on the conductive posts 110a. As a result, the fabrication costs and the fabrication cycle time of the integrated fan-out package of the disclosure are further reduced.

On the other hand, even if the heights of the pre-fabricated conductive posts 110a are different, during the reflowing process, depths of the conductive posts 110a embedded in the solder joints 108 can be adjusted, such that the upper surfaces 111b of the conductive posts 110a are substantially co-planar or nearly the same. In other words, the solder joints 108 between the first redistribution conductive layers 102b and the conductive posts 110a have an effect of enhancing the coplanarity between the upper surfaces 111b of the conductive posts 110a.

FIG. 19 is an enlarged schematic partial cross sectional view of the conductive posts of FIG. 8. Referring to FIG. 19, after the conductive posts 110c are transfer-bonded to the first redistribution conductive layers 102b from the pallet 10, bottom portions of the conductive posts 110c may be disposed on the solder joints 108a or embedded in the solder joints 108b. A thickness t2 of the solder joints 108 under the conductive posts 110 is smaller than a height t3 of the conductive posts 110. The height t3 of the conductive posts 110 ranges from 100 μm to 500 μm, and the thickness t2 of the solder joints 108 under the conductive posts 110 ranges from 2 μm to 10 μm, and, for example. In some embodiments, t2/t3 ranges from 0.004 to 0.1. In some embodiments, the embedded depth t1 of the bottom portions of the conductive posts 110c is less than ⅓ of the height t3 of the conductive posts 110. That is, t1/t3 is less than ⅓. In some embodiments, the embedded depth t1 of the bottom portions of the conductive posts 110c is less than 30 micrometers. In alternative embodiments, the embedded depth t1 of the bottom portions of the conductive posts 110c is less than 10 micrometers. A level height difference ΔH between the upper surfaces 111b of the conductive posts 110c may be less than 10 micrometers. The level height difference ΔH may be regarded as co-planar without affecting the following processes, and therefore, the grinding process to be performed on the conductive posts 110c is omitted.

Specifically, as shown in FIG. 19, at least one of the solder joints 108a and 108b has arc-sidewalls S108 concaved toward the center of the respective solder joints 108a and 108b. Take the solder joint 108a as an example, the solder joint 108a has tapered sidewalls S108. A horizontal cross-sectional area of the solder joint 108a gradually decreases in a direction from the first redistribution conductive layers 102b toward the corresponding conductive posts 110c. In some embodiments, an upper width W2 of the solder joint 108a is equal to a lower width W1 of the conductive post 110c on the solder joint 108a, while a lower width W3 of the solder joint 108a is larger than the lower width W1 of the conductive post 110c on the solder joint 108a. In alternative embodiments, the solder joint 108b covers a portion of the sidewalls S110 of the corresponding conductive post 110c, and an upper width W4 of the solder joint 108b is larger than the lower width W1 of the conductive post 110c on the solder joint 108b, wherein the upper width W4 is located at an interface between the solder joint 108b and the corresponding conductive post 110c. In other words, after the reflowing process is performed, the solder joint 108b is formed having a recess R on the top surface thereof. A depth t1 of the recess R is less than 10 micrometers, for example. A bottom portion of the conductive post 110c is partially inserted into the recess R.

Referring back to FIG. 8 and FIG. 9, a die 112 is mounted onto the first redistribution conductive layers 102c by an adhesive AD. In some embodiments, the die 112 is directly bond onto the first redistribution conductive layers 102c via the adhesive AD. The adhesive AD is filled in the openings in the first redistribution conductive layers 102c and covers the upper surfaces of the first redistribution conductive layers 102c. The die 112 is electrically insulated from the first redistribution conductive layers 102c by the adhesive AD. In some embodiments, the adhesive AD serves as a die attach film (DAF) or film over wire (FoW). The die 112 has an active surface 112a and a back surface 112f opposite to the active surface 112a. In some embodiments, the die 112 includes a plurality of pads 112b, a passivation layer 112c, and a plurality of conductive pillars 112d. The passivation layer 112c covers the active surface 112a and portions of the pads 112b. The pads 112b are partially exposed by the passivation layer 112c. The conductive pillars 112d are formed on and electrically connected to the pads 112b. The back surface 112f of the die 112 is in contact with the adhesive AD. The conductive pillars 112d are copper pillars or other suitable metal pillars, for example.

Figure 9:
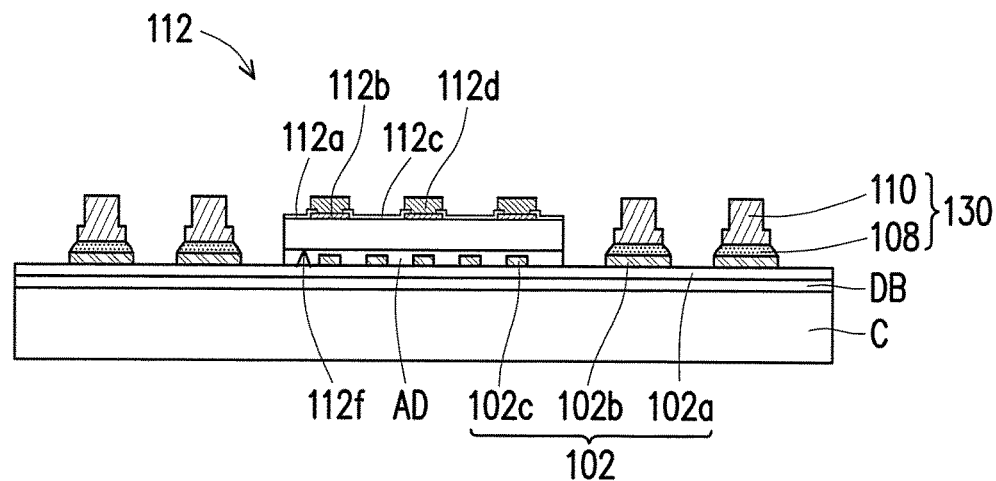

In FIG. 9, only one die 112 is mounted onto the first redistribution conductive layers 102c. However, the number of the dies 112 is merely for illustration, and the disclosure is not limited thereto. In alternative embodiments, a plurality of dies 112 are mounted onto the first redistribution conductive layers 102c, and the dies 112 placed on the first redistribution conductive layers 102c may be arranged in an array. When the plurality of dies 112 are mounted on the first redistribution conductive layers 102c, a plurality of groups of the conductive posts 110 may be mounted on the first redistribution conductive layers 102b and each of the dies 112 is surrounded by one group of the conductive posts 110.

Figure 10:
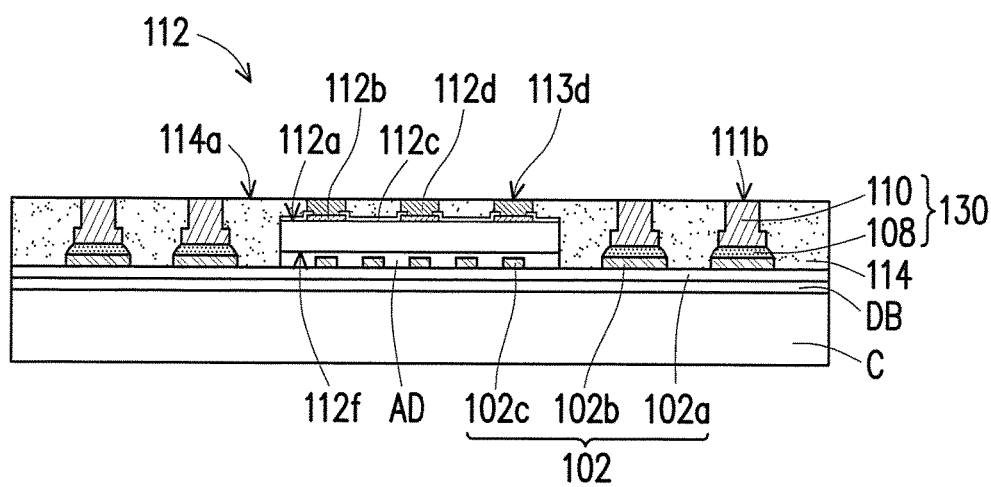

Referring to FIG. 10, an insulating material (not shown) is formed on the carrier C to cover surfaces of the solder joints 108, the conductive posts 110 and the die 112. In some embodiments, the insulating material may be a molding compound formed by a molding process. In some embodiments, the insulating material may include epoxy or other suitable materials. Then, the insulating material and portions of the die 112 are ground until the upper surfaces of the conductive pillars 112d are exposed. After the insulating material is ground, an insulating encapsulation 114 is formed over the first redistribution circuit structure 102 to encapsulate sidewalls of the die 112, the sidewalls of the conductive posts 110, and the sidewalls of the solder joints 108. In some embodiments, during the above-mentioned grinding process, portions of the insulating material, portions of the conductive pillars 112d and portions of the conductive posts 110 are removed until the upper surfaces of the conductive pillars 112d and the upper surfaces 111b of the conductive posts 110 are exposed. In some embodiments, the insulating encapsulation 114 may be formed by mechanical grinding and/or chemical mechanical polishing (CMP).

The insulating encapsulation 114 encapsulates the sidewalls of the die 112 and the sidewalls of the conductive structures 130. That is, the conductive structures 130 and the die 112 are embedded in the insulating encapsulation 114. In other words, the conductive structures 130, which include the solder joints 108 and the conductive posts 110, penetrate the insulating encapsulation 114, and the upper surfaces 111b of the conductive posts 110 are exposed. It is noted that the upper surfaces 111*b* of the conductive posts 110 and the upper surfaces 113*d* of the conductive pillar 112*d* are substantially coplanar with the upper surface 114*a* of the insulating encapsulation 114 after the above-mentioned grinding process.

In alternative embodiments, the coplanarity between the upper surfaces 111*b* of the conductive posts 110 is good enough, and thus the grinding process is omitted. Specifically, after the die 112 is mounted on the first redistribution conductive layers 102*c*, the upper surfaces 111*b* of the conductive posts 110 and the upper surfaces 113*d* of the conductive pillar 112*d* are substantially coplanar. A release film (not shown) is adhered to the upper surfaces 111*b* of the conductive posts 110 and the upper surfaces 113*d* of the conductive pillar 112*d*. Then, a mold (not shown) is applied to fix the carrier C having the release film, the die 112 and the conductive posts 110 thereon. Next, the insulating material (not shown) is filled in gaps among the release film, the die 112, and the conductive structures 130, and then a curing process is performed, so as to form the insulating encapsulation 114. Namely, the release film is able to prevent the insulating encapsulation 114 from adhering to the upper surfaces 111*b* of the conductive posts 110 and the upper surfaces 113*d* of the conductive pillar 112*d*. As a result, the grinding process may be omitted, such that the fabrication costs and the fabrication cycle time of the disclosure are reduced.

Figure 11:
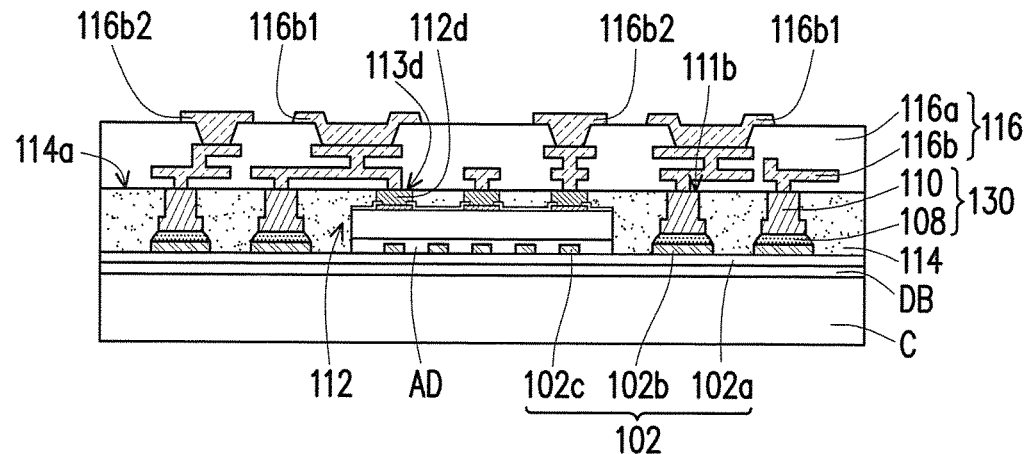

Referring to FIG. 11, after the insulating encapsulation 114 is formed, a second redistribution circuit structure 116 is formed on the upper surfaces 111*b* of the conductive posts 110, the upper surface 114*a* of the insulating encapsulation 114, and the upper surfaces 113*d* of the conductive pillars 112*d*. As shown in FIG. 11, the second redistribution circuit structure 116 includes a plurality of second dielectric layers 116*a* and a plurality of second redistribution conductive layers 116*b* stacked alternately. The second redistribution conductive layers 116*b* are electrically connected to the conductive pillar 112*d* of the die 112 and the conductive posts 110. Namely, the conductive structures 130, which include the solder joints 108 and the conductive posts 110, are electrically connected to the first redistribution circuit structure 102 and the second redistribution circuit structure 116. In some embodiments, the upper surfaces 113*d* of the conductive pillars 112*d* and the upper surfaces 111*b* of the conductive posts 110 are in contact with the bottommost second redistribution conductive layer 116*b* of the second redistribution circuit structure 116. The upper surfaces 113*d* of the conductive pillars 112*d* and the upper surfaces 111*b* of the conductive posts 110 are partially covered by the bottommost second dielectric layer 116*a*. Furthermore, the topmost second redistribution conductive layer 116*b* includes a plurality of pads. In some embodiments, the above-mentioned pads include a plurality of under-ball metallurgy (UBM) patterns 116*b*1 for ball mount and/or at least one connection pad 116*b*2 for mounting of passive components. The number of the UBM patterns 116*b*1 and the connection pads 116*b*2 is not limited in this disclosure.

Figure 12:
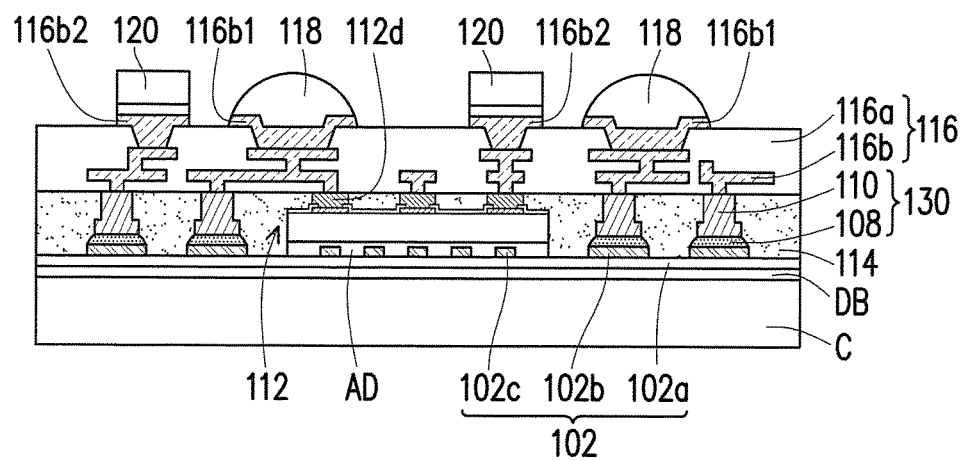

Referring to FIG. 12, after the second redistribution circuit structure 116 is formed, a plurality of first conductive terminals 118 are placed on the UBM patterns 116*b*1, and a plurality of passive components 120 are mounted on the connection pads 116*b*2. In some embodiments, the first conductive terminals 118 are placed on the UBM 116*b*1 through a ball placement process, and the passive components 120 are mounted on the connection pads 116*b*2 through a soldering process or a reflowing process.

Figure 13:
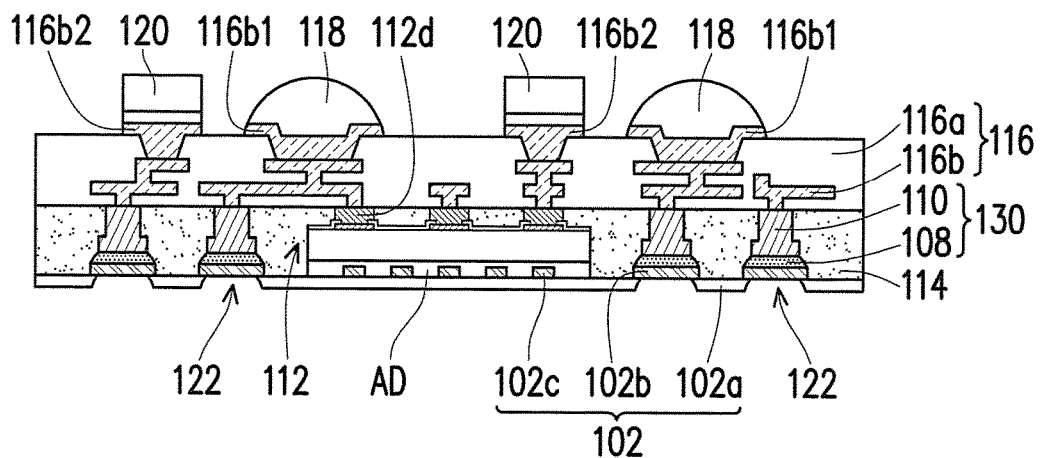

Referring to FIG. 12 and FIG. 13, after the first conductive terminals 118 and the passive components 120 are mounted on the second redistribution circuit structure 116, the first dielectric layer 102*a* is de-bonded from the de-bonding layer DB, such that the first dielectric layer 102*a* is separated or delaminated from the de-bonding layer DB and the carrier C. In some embodiments, the de-bonding layer DB (e.g., the LTHC release layer) may be irradiated by an UV laser such that the first dielectric layer 102*a* is peeled from the carrier C.

As shown in FIG. 13, the first dielectric layer 102*a* is then patterned such that a plurality of contact openings 122 are formed to expose the lower surfaces of the first redistribution conductive layers 102*b*. In some embodiments, the number of the contact openings 122 formed in the first dielectric layer 102*a* is corresponding to the number of the first redistribution conductive layers 102*b*.

Figure 14:
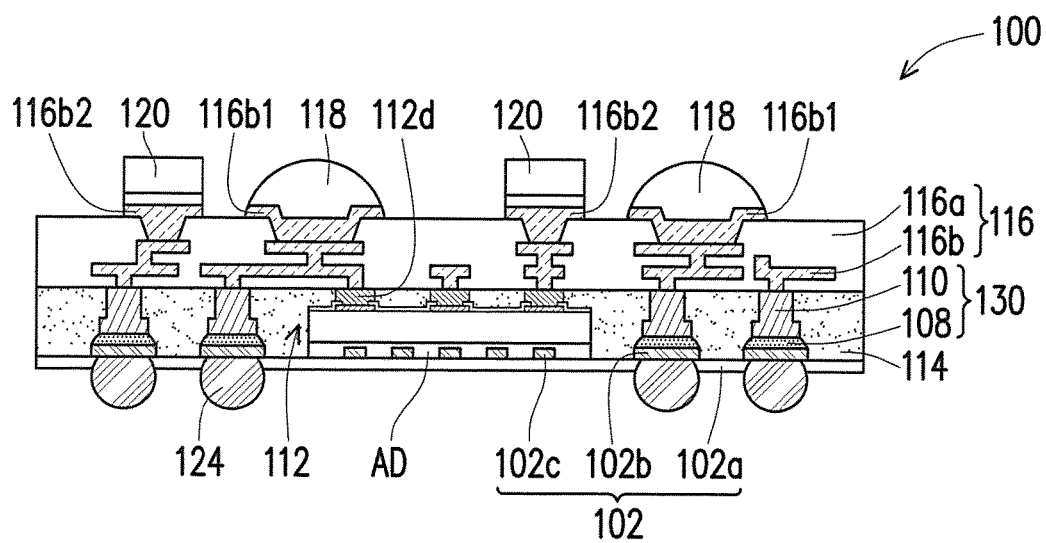

Referring to FIG. 14, after the contact openings 122 are formed in the first dielectric layer 102*a*, a plurality of second conductive terminals 124 (e.g., conductive balls) are placed on the lower surfaces of the first redistribution conductive layers 102*b* that are exposed by the contact openings 122. In some embodiments, the second conductive terminals 124 (e.g., conductive balls) are reflowed to be bonded to the exposed surfaces of the first redistribution conductive layers 102*b*. In other words, the second conductive terminals 124 are electrically connected to the first redistribution conductive layers 102*b*. As shown in FIG. 14, after the first conductive terminals 118 and the second conductive terminals 124 are formed, an integrated fan-out package 100 having dual-side terminals is accomplished.

Figure 15:
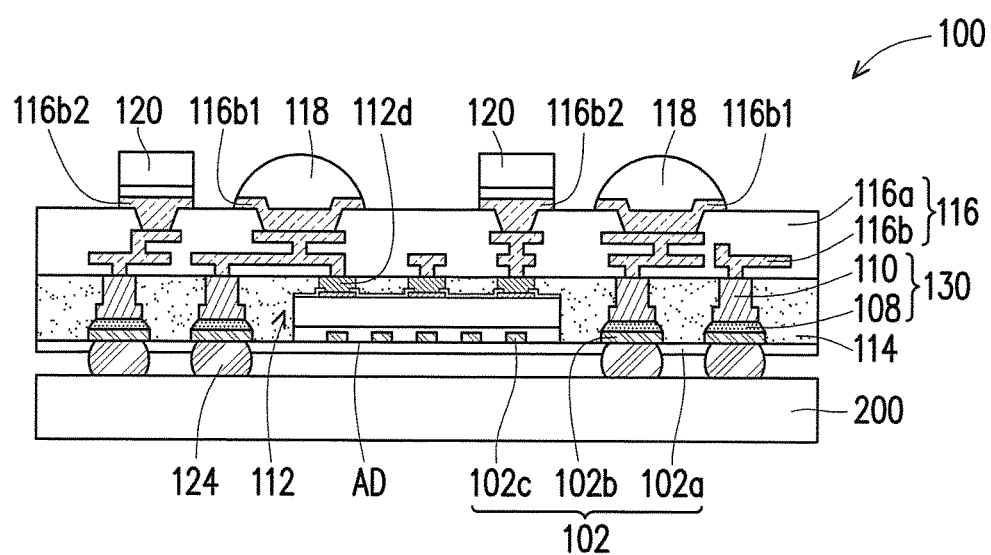

Referring to FIG. 15, another package 200 is then provided. In some embodiments, the package 200 is a memory device. The package 200 is stacked over and is electrically connected to the integrated fan-out package 100 illustrated in FIG. 14 through the second conductive terminals 124, such that a package-on-package (POP) structure is fabricated.

According to some embodiments, a die is directly mounted onto the first redistribution conductive layers by an adhesive. In addition, the die is connected to a first redistribution circuit structure over a back surface of the die and a second redistribution circuit structure over an active surface of the die via a plurality of solder joints and a plurality of conductive posts. The conductive posts are mounted onto the first redistribution circuit structure through the solder joints. The solder joints are formed between the first redistribution circuit structure and the conductive posts to enhance the coplanarity between the upper surfaces of the conductive posts.

According to some embodiments, an integrated fan-out package includes a die, a first redistribution circuit structure, a second redistribution circuit structure, a plurality of solder joints, a plurality of conductive posts, and an insulating encapsulation. The first redistribution circuit structure and the second redistribution circuit structure are formed respectively over a back surface and an active surface of the die to sandwich the die. The solder joints are formed aside the die and connected to the first redistribution circuit structure. The conductive posts are formed on the solder joints and connected to the second redistribution circuit structure, and connected to the first redistribution circuit structure through the solder joints. A plurality of sidewalls of the die, a plurality of sidewalls of the conductive posts, and a plurality of sidewalls of the solder joints are encapsulated by the insulating encapsulation.

According to some embodiments, an integrated fan-out package includes a die, a first redistribution circuit structure, a second redistribution circuit structure, an insulating encapsulation, a plurality of conductive structures, a plurality of first conductive terminals, and a plurality of second conductive terminals. The first redistribution circuit structure is formed over a back surface of the die. The second redistribution circuit structure is formed on an active surface of the die. The insulating encapsulation is formed aside the die to encapsulate the die. The conductive structures penetrate the insulating encapsulation. At least one of the conductive structures includes a first portion and a second portion on the first portion. The first portion is electrically connected to the first redistribution circuit structure. The second portion is electrically connected to the second redistribution circuit structure, and electrically connected to the first redistribution circuit structure through the first portion. A material of the first portion and a material of the second portion are different. The first conductive terminals are electrically connected to the second redistribution circuit structure. The second conductive terminals are electrically connected to the first redistribution circuit structure.

According to some embodiments, a method of fabricating an integrated fan-out package includes the following steps. A first redistribution circuit structure is formed on a carrier. The first redistribution circuit structure includes a first dielectric layer and a plurality of first redistribution conductive layers on the first dielectric layer. A plurality of solder joints are formed on a portion of the first redistribution conductive layers. A plurality of conductive posts are mounted on the first redistribution conductive layers through the solder joints respectively. A die is mounted on another portion of the first redistribution conductive layers by an adhesive. An insulating encapsulation is formed to encapsulate a plurality of sidewalls of the die, a plurality of sidewalls of the conductive posts, and a plurality of sidewalls of the solder joints. A second redistribution circuit structure is formed on the insulating encapsulation, the die, and the conductive posts. The second redistribution circuit structure is electrically connected to the die and the conductive posts. The carrier is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
    a die;
    a first redistribution circuit structure and a second redistribution circuit structure respectively over a back surface and an active surface of the die to sandwich the die;
    a plurality of solder joints, aside the die and connected to the first redistribution circuit structure;
    a plurality of conductive posts, on the solder joints and connected to the second redistribution circuit structure, and connected to the first redistribution circuit structure through the solder joints; and
    an insulating encapsulation, encapsulating a plurality of sidewalls of the die, a plurality of sidewalls of the conductive posts, a plurality of sidewalls of first redistribution conductive layers of the first redistribution circuit structure, and a plurality of sidewalls of the solder joints,
    wherein upper surfaces of the conductive posts are partially covered by a bottommost dielectric layer of the second redistribution circuit structure.

2. The integrated fan-out package of claim 1, wherein the die is bonded to the first redistribution circuit structure by an adhesive.

3. The integrated fan-out package of claim 1, wherein a material of the solder joints and a material of the conductive posts are different.

4. The integrated fan-out package of claim 1, wherein a thickness of the solder joints under the conductive posts is smaller than a height of the conductive posts.

5. The integrated fan-out package of claim 1, wherein at least one of the solder joints has a plurality of arc-sidewalls or a plurality of tapered sidewalls.

6. The integrated fan-out package of claim 1, wherein an upper width of each of the solder joints is larger than or equal to a lower width of each of the conductive posts, and a lower width of each of the solder joints is larger than the lower width of each of the conductive posts.

7. The integrated fan-out package of claim 1, wherein a horizontal cross-sectional area of at least one of the solder joints gradually decreases toward a corresponding conductive post.

8. The integrated fan-out package of claim 1, wherein the conductive posts comprise I-shaped conductive posts, T-shaped conductive posts, or a combination hereof.

9. The integrated fan-out package of claim 1, wherein at least one of the solder joints covers a portion of a plurality of sidewalls of a corresponding conductive post.

10. An integrated fan-out package, comprising:
    a die;
    a first redistribution circuit structure, over a back surface of the die;
    a second redistribution circuit structure, over an active surface of the die;
    an insulating encapsulation, aside the die to encapsulate the die and a plurality of sidewalls of first redistribution conductive layers of the first redistribution circuit structure;
    a plurality of conductive structures, penetrating the insulating encapsulation, wherein at least one of the conductive structures comprises:
        a first portion electrically connected to the first redistribution circuit structure; and
        a second portion on the first portion and electrically connected to the second redistribution circuit structure, and electrically connected to the first redistribution circuit structure through the first portion, wherein a material of the first portion and a material of the second portion are different, and an upper surface of the second portion is partially covered by a bottommost dielectric layer of the second redistribution circuit structure;
    a plurality of first conductive terminals electrically connected to the second redistribution circuit structure; and
    a plurality of second conductive terminals electrically connected to the first redistribution circuit structure.

11. The integrated fan-out package of claim 10, wherein a melting point of the first portion is lower than a melting point of the second portion.

12. The integrated fan-out package of claim 10, wherein the first portion has a plurality of arc-sidewalls or a plurality of tapered sidewalls.

13. The integrated fan-out package of claim 10, wherein the die is bonded to the first redistribution circuit structure by an adhesive.

14. The integrated fan-out package of claim 10, wherein the first portion further covers a portion of a plurality of sidewalls of the second portion.

15. A fabricating method of an integrated fan-out package, the fabricating method comprising:
    forming a first redistribution circuit structure on a carrier, wherein the first redistribution circuit structure comprises a first dielectric layer and a plurality of first redistribution conductive layers on the first dielectric layer;
    forming a plurality of solder joints on a portion of the first redistribution conductive layers;
    mounting a plurality of conductive posts on the first redistribution conductive layers through the solder joints respectively;
    mounting a die on another portion of the first redistribution conductive layers by an adhesive;
    forming an insulating encapsulation to encapsulate a plurality of sidewalls of the die, a plurality of sidewalls of the conductive posts, the plurality of sidewalls of the first redistribution conductive layers, and a plurality of sidewalls of the solder joints;
    forming a second redistribution circuit structure on the insulating encapsulation, the die, and the conductive posts, wherein the second redistribution circuit structure is electrically connected to the die and the conductive posts, and upper surfaces of the conductive posts are partially covered by a bottommost dielectric layer of the second redistribution circuit structure; and
    removing the carrier.

16. The fabricating method of claim 15, wherein a method of mounting the conductive posts on the solder joints comprises:
    placing the conductive posts in a plurality of holes of a pallet respectively;
    forming a plurality of solder pastes on the portion of the first redistribution conductive layers of the carrier;
    flipping the carrier having the solder pastes onto the pallet, to align the solder pastes of the carrier with the conductive posts in the holes of the pallet; and
    performing a reflowing process on the solder pastes to form the solder joints and fix the conductive posts on the solder joints.

17. The fabricating method of claim 16, wherein the holes of the pallet comprise a plurality of blind holes or through holes.

18. The fabricating method of claim 16, wherein a plurality of upper surfaces of the conductive posts are substantially co-planar after performing the reflowing process.

19. The fabricating method of claim 16, wherein a level height different between the upper surfaces of the conductive posts is less than 10 micrometers after performing the reflowing process.

20. The fabricating method of claim 15, further comprising:
    before removing the carrier, forming a plurality of first conductive terminals on the second redistribution circuit structure respectively; and
    after removing the carrier, patterning the first dielectric layer to expose a plurality of surfaces of the first redistribution conductive layers, and forming a plurality of conductive terminals on the exposed surfaces of the first redistribution conductive layers respectively.

* * * * *